United States Patent [19]

Legory

[11] 4,168,486
[45] Sep. 18, 1979

[54] SEGMENTED ERROR-CORRECTION SYSTEM

[75] Inventor: John E. Legory, Paoli, Pa.

[73] Assignee: Burroughs Corporation, Detroit, Mich.

[21] Appl. No.: 920,841

[22] Filed: Jun. 30, 1978

[51] Int. Cl.² ............................................. G06F 11/12
[52] U.S. Cl. ........................... 340/146.1 AL; 235/312
[58] Field of Search ............... 340/146.1 AL; 235/312

[56] References Cited

U.S. PATENT DOCUMENTS

| | | | |
|---|---|---|---|
| 3,638,182 | 1/1972 | Burton et al. | 340/146.1 AL |
| 3,742,449 | 6/1973 | Blair | 340/146.1 AL |
| 3,745,525 | 7/1973 | Hong et al. | 340/146.1 AL |
| 3,801,955 | 4/1974 | Howell | 340/146.1 AL |

*Primary Examiner*—Charles E. Atkinson
*Attorney, Agent, or Firm*—Edward J. Feeney, Jr.; Edmund M. Chung; Leonard C. Brenner

[57] ABSTRACT

In a data processing error control system for named data, a parity check matrix and apparatus for using same provides for single error correcting of the data word and for multiple error detecting in both the data word and data name. The parity check matrix and apparatus utilize two additional parity check bits (over that required by a system using a prior art SEC/DED Hamming code) to provide protection against single bit errors, eight contiguous bit errors (i.e., hardware stuck at logical one or logical zero for the whole eight contiguous bits), similar four contiguous bit errors, and faults covering the entire data name field (which could occur, for example, if a wrong data word was fetched from memory). The parity check matrix is segmented and mated to the error correctional requirements and prevalent error modes of each field being protected. In encoding, parity check bits are generated for the combined data word and associated data name field. In decoding, an overall parity check of the check bits, data word and data name is performed for distinguishing between odd and even errors. Further, the parity check matrix is invoked to generate a parity checking number for addressing a decoding table circuit (realizable as a ROM) which in turn provides the error bit location for single bit correctable errors. Given the error bit location a correction circuit corrects (i.e., complements) the detected single erroneous bit in the data word or in the generated parity check bits.

14 Claims, 6 Drawing Figures

Fig.1

| | |
|---|---|
| 83 | 43 |
| 84 | 300 |
| 85 | 45 |
| 86 | 46 |
| 87 | 47 |
| 88 | 112 |
| 89 | 177 |
| 90 | 50 |
| 91 | 51 |
| 92 | 308 |
| 93 | 53 |
| 94 | 54 |
| 95 | 55 |
| 96 | 316 |
| 97 | 185 |
| 98 | 58 |
| 99 | 59 |
| 100 | 120 |
| 101 | 61 |
| 102 | 1 |
| 103 | 2 |
| 104 | 4 |
| 105 | 8 |
| 106 | 16 |
| 107 | 32 |
| 108 | 64 |
| 109 | 128 |
| 110 | 256 |
| 111 | 0 |

| (OUTPUT) BIT LOCATION | (INPUT) DECIMAL VALUE OF 9-BIT CHECKING NO. | COMMENTS |
|---|---|---|
| 0-47 | 384-511 | ALL CHECKING NOS. IN THIS RANGE INDICATE A DETECTED BUT UNCORRECTABLE ERROR. |
| 48-111 | 0-383 | 320 CHECKING NOS. IN THIS RANGE INDICATE AN UNCORRECTABLE ERROR. THE REMAINING 64 BELOW, INDICATE CORRECTABLE SINGLE-BIT ERRORS. |
| 48 | 72 | |
| 49 | 137 | |
| 50 | 10 | |
| 51 | 11 | |
| 52 | 268 | |
| 53 | 13 | |
| 54 | 14 | |
| 55 | 15 | |
| 56 | 80 | |
| 57 | 145 | |
| 58 | 18 | |
| 59 | 19 | |
| 60 | 276 | |
| 61 | 21 | |
| 62 | 22 | |
| 63 | 23 | |
| 64 | 88 | |
| 65 | 153 | |
| 66 | 26 | |
| 67 | 27 | |
| 68 | 284 | |
| 69 | 29 | |
| 70 | 30 | |
| 71 | 31 | |
| 72 | 96 | |
| 73 | 161 | |
| 74 | 34 | |
| 75 | 35 | |
| 76 | 292 | |
| 77 | 37 | |
| 78 | 38 | |
| 79 | 39 | |
| 80 | 104 | |
| 81 | 169 | |
| 82 | 42 | |

*Fig.4A*

| FIG.4A |
|---|
| FIG.4B |

*Fig.4*

SEGMENTED ERROR-CORRECTION SYSTEM

CROSS REFERENCE TO RELATED APPLICATION

In copending application, Ser. No. 893,068 for an "ERROR CONTROL SYSTEM FOR NAMED DATA", filed Apr. 3, 1978, in the name of K. L. York et al, and assigned to the assignee of the present invention, there is disclosed an error control system for named data. Although not limited particularly thereto, the present invention is tailored to function in such an error control system for named data environment.

BACKGROUND AND OBJECTS OF THE INVENTION

In the prior art many error detecting and error correcting codes have been evolved to insure the integrity of the data to be processed. Generic to all of these codes is redundancy, wherein additional bits are added to the data bits as a function thereof with the check bits being recomputed as desired for error detection and possible correction.

One class of codes, known as single error correction, double error detection, (SEC/DED) is described by R. W. Hamming in "Error Detecting and Error Correcting Codes", Bell Systems Technical Journal, 29, 1950, pages 147–160.

The Hamming and similar codings function effectively in situations where single and double errors predominate; for example, magnetic core memories, which belong to an older technology. Newer technologies employing solid state components and in particular integrated circuits, display a fault behavior which differs from the older technologies; while single bit errors still predominate, higher-order errors now appear in numbers which cannot be neglected. It is characteristic of the new technologies that these higher order errors result from a stuck logic module in which a group of four (4) and eight (8) or some other number of contiguous bit positions become stuck in the logical one (1) or zero (0) state. Similar fault patterns also occur in transmission circuitry.

In an error correction system using a parity check code the parity checking operation may be described by the relation $$AW = C$$

where A is the parity check matrix having m rows and n columns, W is a code word n bits in length, and C is the m bit result, which is sometimes called the checking number; there are m parity check bits. In a system using a single error correcting Hamming code the binary values of the columns of the A matrix run from 1 through n. The above relation may be expressed in component form as follows:

$$A[1,1]\,W[1] + A[1,2]\,W[2] + \ldots + A[1,n]\,W[n] = C[1]$$
$$A[2,1]\,W[1] + A[2,2]\,W[2] + \ldots + A[2,n]\,W[n] = C[2]$$
$$\vdots$$
$$A[m,1]\,W[1] + A[m,2]\,W[2] + \ldots + A[m,n]\,W[n] = C[m]$$

A valid code word, W, will give a checking number, C, all of whose components are zero. If bit i in a code word W is the only error, then C becomes in component form $$C[1] = A[1,i]$$
$$C[2] = A[2,i]$$
$$\vdots$$
$$C[m] = A[m,i].$$

Since stored and transmitted data tend to be made up of random patterns of 0's and 1's (over a sufficiently long time period) a stuck logic fault affecting n bit positions can manifest itself in any one of 2 raised to the nth power quantity $-1$ equally likely error patterns. Of the resulting 2 raised to the $n-1$ power odd error patterns, 2 raised to the $[n-1]$ power quantity $-n$ are higher-order odd errors (i.e., 3 or more erroneous bits). In such a situation a prior art error correction system based on a Hamming code performs poorly because of the large number of mistaken corrections. A SEC/DED Hamming code also detects all 2-bit errors; however, a large percentage of the higher-order (4 or more) even errors are undetected. Because of these characteristics a correction system utilizing a Hamming code is not well suited to the new memory and transmission technologies.

Another disadvantage of prior art correction systems based on the Hamming code is apparent when the word to be encoded consists of two or more independent strings of bits. For example, in copending application, Ser. No. 893,068, for an "ERROR CONTROL SYSTEM FOR NAMED DATA", filed Apr. 3, 1978, the data word and its data name are concatenated and the combined word encoded with only the check bits and data word being stored. In such a system the data name is independent of the physical address in memory containing the associated data word and a faulty fetch operation can produce a data word which, although it is from a near-by physical location memory, will have an associated data name which differs from the desired one in a random way. That is, the error patterns in the data name field tend to be randomly distributed over that field. Thus the errors of major concern would be different for the data word and data name portions of a code word. The error checking code should accommodate differing failure modes across a code word. The binary value of the ith column of A is i in most system implementations using a Hamming code. Thus the binary value of C locates the position of the erroneous bit in W. If bits i, j, and k are in error then C is given by the modulo 2 sums $$C[1] = A[1,i] + A[1,j] + A[1,k]$$
$$C[2] = A[2,i] + A[2,j] + A[2,k]$$
$$\vdots$$
$$C[m] = A[m,i] + A[m,j] + A[m,k].$$

In this case the checking number mistakenly points to a bit location to be corrected. If this location is in the valid addressing range, 1 through n, a mistaken correction will be made. If C is in the range $n+1$ through 2 raised to the power m quantity $-1$, an uncorrectable error can be detected and a mistaken correction thus avoided, provided the appropriate circuitry is provided. However, as the length of n of a Hamming code increases toward a power of two, opportunities for preventing at least some mistaken corrections vanish.

Therefore, it is an object of the present invention to provide an error correction method and system for reliable error detection and correction in the new data transmission and storage technologies.

It is another object of the present invention to provide an error correction method and system for reliable error detection of error patterns randomly distributed over a group of contiguous bits.

It is yet another object of the present invention to provide in a named data environment an error correction method and system tailored to cover reliably both data words and associated data names.

SUMMARY OF THE INVENTION

In carrying out the above and other objects of this invention a parity check matrix and apparatus for named data provides for single error correcting of a data word and for multiple error detecting in both the data word and its associated data name. The parity check matrix and apparatus utilize two additional parity check bits (over and above that required by a system using a prior art SEC/DED Hamming code) to provide protection against single bit errors, eight contiguous bit errors (i.e., logic hardware stuck at logical one or logical zero for the whole eight contiguous bits), similar four contiguous bit errors, and faults covering the entire data name field (which could occur, for example, if a wrong data word was fetched from memory.) The parity check matrix is segmented and mated to the error correctional requirements and prevalent error modes of each field being protected. In encoding, parity check bits are generated for the combined data word and associated data name field. In decoding, an overall parity check of the check bits, data word and data name is performed for distinguishing between odd and even errors. Further, the parity check matrix is invoked to generate a parity checking number for addressing a decoding table circuit (realizable as a ROM) which in turn provides the error bit location for single bit correctable errors. Given the error bit location a correction circuit corrects (i.e., complements) the detected single erroneous bit in the data word or in the generated parity check bits.

The system configuration and operational details given above have been presented in simplified form. The foregoing and other objects, features and advantages will be apparent from the following more particular description of a preferred embodiment of the invention.

BRIEF DESCRIPTION OF THE DRAWING

FIG. 1 depicts a 112 column 10 row parity check matrix used in the preferred embodiment of the present invention wherein row 10 provides for an overall parity check and wherein columns 0–47 provide a data name check, columns 48–101 provide a data word check, and columns 102–111 provide a check of error code bits;

FIG. 2 is a diagram of an encoder used in the segmented error-correction system of the present invention;

FIG. 4 is an illustration of the relation between FIG. 4A and FIG. 4B; and

FIG. 4A and FIG. 4B are presentations in tabular format of the operation of a decoding table circuit used in the decoder of FIG. 3.

DESCRIPTION OF THE PREFERRED EMBODIMENT

Figures 2, 4B:
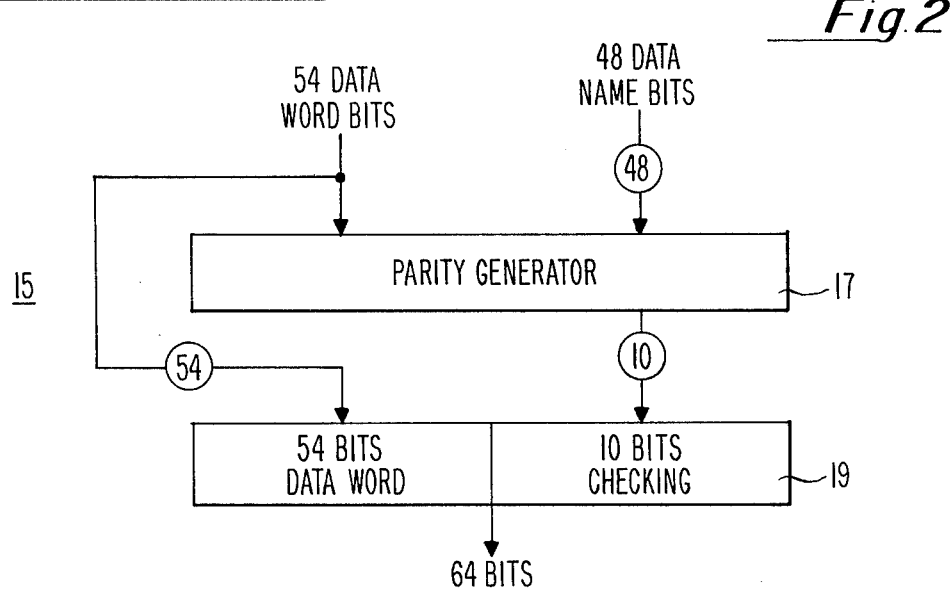

In the segmented error correcting system of the present invention, the preferred embodiment thereof includes a data word of 54 bits, a data name associated therewith of 48 bits and 10 check bits to form a code word of 112 bits. Although the encoding covers both a data word and its associated data name, only the data word and the check bits (64 bits total) are stored. It is noted that the checking code of the present invention utilizes two additional parity checks over and above that required by a standard SEC/DED Hamming code. The checking code of the present invention provides complete protection against the following faults:

1. Detection of single bit errors in any one of 112 bit locations with correction of errors within a 64 bit portion thereof;

2. Detection of two bit errors regardless of location. The checking code of the present invention further provides improved protection against the following faults:

1. Detection of a single group of eight contiguous bit errors. There are fourteen such groups of eight contiguous bits in a 112 bit word.

2. Detection of a single group of four contiguous bit errors. There are twenty-eight such groups of four contiguous bits in a 112 bit word with one boundary of each four bit group coinciding with a boundary of an eight contiguous bit group.

3. Detection of a fault covering a whole data name field such as would occur if the wrong name had been fetched. In such a fault, error patterns are randomly distributed over the entire field.

Figure 1:
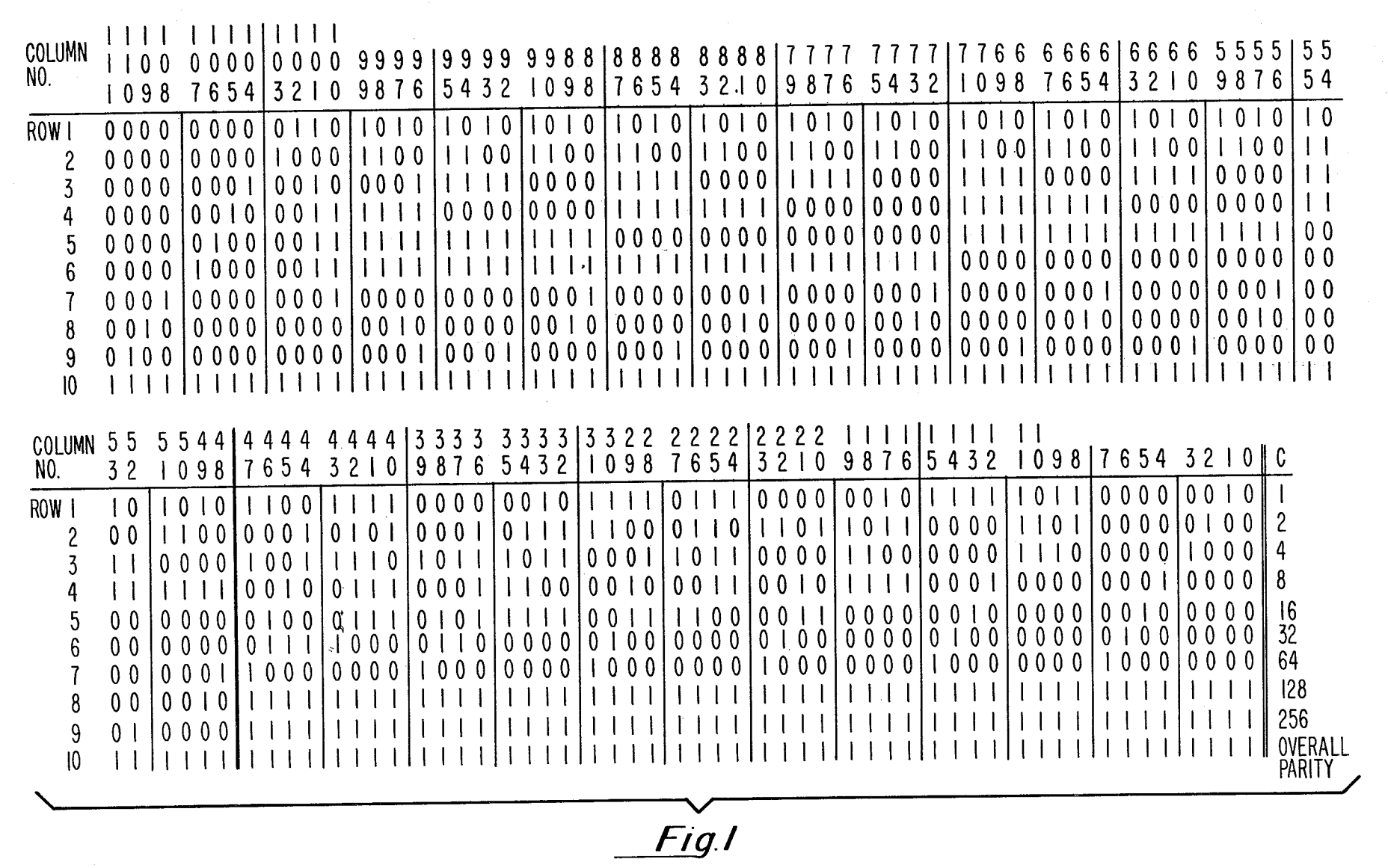

The parity check matrix providing the above-cited protection capabilities is shown in FIG. 1, comprising ten (10) rows (1 row for each parity check) and 112 columns (for the 112 bit code word.) As used in the preferred embodiment of the present invention, the data name field occupies bit locations 1 through 47, the data word field bits 48 through 101 and the check bits occupy bit locations 102 through 111. FIG. 1 is segmented into four and eight bit groupings from bit location 0 through bit location 111.

As shown, the 1's (logical ones) in row 1 of the matrix of FIG. 1 indicate which bits of the 112-bit code word are included in the first parity check. Likewise, the 1's in row 2 indicate the bits included in the second parity check and following progressively, the 1's in row 9 indicate the bits included in the ninth parity check. Row 10 is an overall parity check which provides for double error detection. In a given 8-bit group (where a fault has occurred) of a code word all 2 raised to the power of 8 quantity minus 1 error patterns are equally likely. A mistaken correction will occur whenever a 3, 5, or 7 bit error occurs which causes the exclusive OR-ing of the corresponding 3, 5, or 7 columns of the matrix of FIG. 1 to give a valid address. To minimize the number of occurrences of a valid address and hence a mistaken correction, the format of a conventional Hamming matrix is not used; instead, the columns in each 8-column group of the matrix of FIG. 1 are selected from those still remaining in the address space so as to minimize the production of a valid address from the exclusive OR-ing of any set 3, 5 or 7 columns in that group.

In the preferred embodiment, the selection process of a group of 8 columns in the data word field of the matrix where the code word length is 112 bits and which includes nine check bits plus an overall parity bit is as follows:

1. The first three check bits are used to differentiate one column from another within the same 8-column group.

2. The next three check bits are used to differentiate one 8-column group from another.

3. The three additional check bits are used for the mapping of multi-bit odd errors into valid addresses.

When the encoded word contains both a data word and a data name field and consequently may possess radically different fault modes the designation segmented error-correcting system is appropriate in describing the code. As stated previously, a possible fault mode involves the accessing of a wrong data word from memory which results in a randomly distributed error pattern over the whole data name field. In order to prevent these errors from mapping into the word field and causing a mistaken correction there the columns in the data name field of the matrix of FIG. 1 are selected from those remaining in the addressing space so that all odd error patterns occuring in the data name field map back onto the data name field.

As shown, the matrix of FIG. 1 provides for two additional parity checks over and above that which would be utilized by a conventional Hamming code system. The additional parity checks have the effect of enlarging the addressing space of the checking number and thus increasing the number of invalid addresses. In general, if d additional parity check bits are used, then the size of the addressing space increases from 2 raised to the power m quantity minus 1 to 2 raised to the power m+d quantity minus 1 wherein m is the number of rows in the conventional (Hamming) parity check matrix.

The matrix of FIG. 1 is divided into a plurality of eight-column group segments corresponding to stuck-logic fault modes involving eight contiguous bits.

More particularly, with reference to FIG. 1, it can be seen that beginning at bit 48 and extending through bit 101, Row 1 comprises a pattern of a single 0 followed by a single 1 followed by a single 0 etc. Row 2 comprises a pattern of a double 0 followed by a double 1 followed by a double 0, etc. Beginning at bit 48 and extending through bit 95, Row 3 comprises a pattern of four 0's followed by four 1's followed by four 0's, etc. Also in Row 3 bits 96 and 101 are also 1's with bits 97 through 100 being 0's. Beginning at bit 48 and extending through bit 99 Row 4 comprises a pattern of eight 1's followed by eight 0's with bits 100 and 101 also being 1's. Beginning at bit 48 Row 5 comprises a pattern of eight 0's, followed by sixteen 1's, followed by sixteen 0's, and followed by fourteen 1's. Beginning at bit 48 Row 6 comprises a pattern of twenty-four 0's followed by thirty 1's. In the data word field (bits 48–101) Row 7 comprises a 1 at bit locations 48, 56, 64, 72, 80, 88, and 100 with 0's elsewhere. Likewise in the data word field (bits 48–101) Row 8 comprises a 1 at bit locations 49, 57, 65, 73, 81, 89, and 97 with 0's elsewhere. Row 9 comprises a 1 at bit locations 52, 60, 68, 76, 84, 92, and 96 with 0's elsewhere. As mentioned above, Row 10 comprises a 1 in all bit locations.

An examination of the data word (bit locations 48 through 101) reveals that there are the following eight bit groups: bits 48–55, bits 56–63, bits 64–71, bits 72–79, bits 80–87, and bits 88–95. Also a six bit group exists, bits 96–101. Note that an exclusive OR-ing of any 3, 5, or 7 columns with an eight-bit group will with few exceptions not be mapped into another eight-bit group in the data word field; therefore, a mistaken correction is not likely to occur in another eight-bit group. Rows 7, 8, and 9 are used to map a large number of 3, 5, or 7 errors into valid addresses in order to prevent mistaken corrections.

In the address field, bits 0–47, error detection only is performed and error correction is never attempted. By assigning all 1's to Rows 8 and 9 of the check matrix of FIG. 1 in bit locations 0 through 47, the exclusive OR-ing of any odd number of columns in the data name field (bits 0–47) produces a checking number whose binary vector notation also has 1's in Rows 8 and 9. Thus a mapping into the data word field (bits 48–101) can never happen due to an odd-bit error in the data name field (bits 0–47).

Since error correction is not performed in the data name field (bits 0–47) the first seven rows of columns 0–47 are selected, preferably as shown in FIG. 1, so as to detect all ever errors occurring within each eight-bit group (0–7, 8–15, 16–23, 24–31, 32–39, 40–47) in the data name field (bits 0–47).

Preferably, as shown, each eight-bit group has seven-element column vectors (i.e., Rows 1–7) for each bit location) which are monotonically increasing in order with binary representations from 0 to 127 and which in any even combination do not produce an undetected (even) error. For each given column the binary representation chosen is unique with respect to all other 47 columns in the 48 bit address field. All even errors occuring via any eight-bit group (and consequently in any four-bit group) in the data name field (bits 0–47) are detected.

Data word values and their associated data names are fed to an encoder 15, see FIG. 2. The encoder includes a parity generator 17 which generates ten parity bits in accord with the ten parity checks (bit locations 102 through 111) shown in FIG. 1. The ten (10) check bits and the fifty-four (54) bit data word field are concatenated in register 19.

Figure 3:
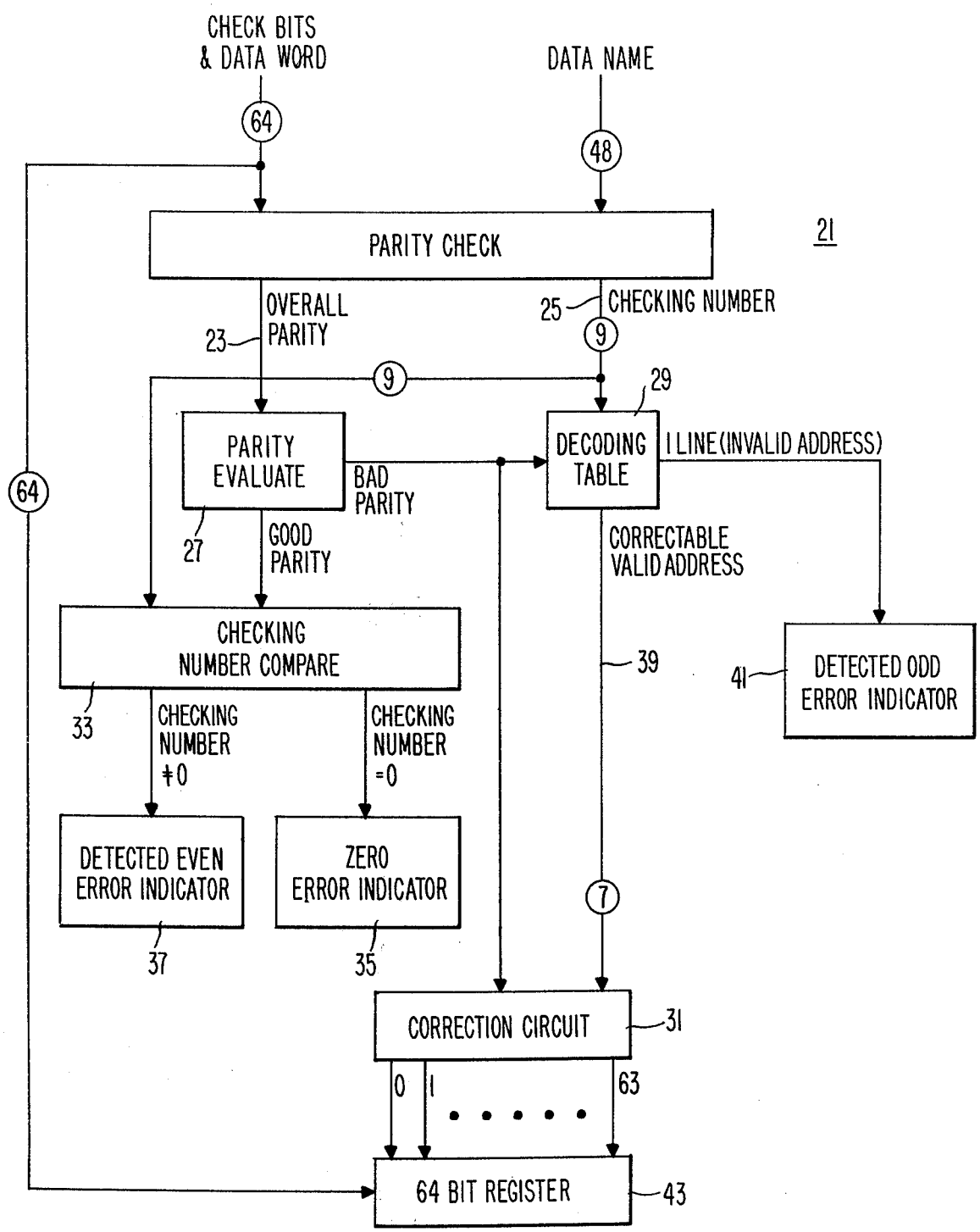
FIG. 3 is a diagram of a decoder used in the segmented error-correction system of the present invention.

Following transmission and/or before storing the concatenated ten check bits, fifty-four data word bits, and the forty-eight data name bits, decoding occurs via decoder 21, see FIG. 3. A parity check circuit 22 performs parity checking on the check bits, data word bits, and data name bits to generate on a single output line 23 an overall parity indicator and on a nine line output bus 25, a nine-bit checking number in accord with the matrix of FIG. 1. As will be recalled, a parity check operation is described by the relation AW=C wherein A is the parity check matrix (FIG. 1) having m (10) rows and n (112) columns, W is the code word (check bits, data word and data name) of n (112) bits length, and C is the m (10) bit checking number included in the illustration of FIG. 3, (single line 23 for overall parity indication and nine-line bus 25 for error address location.

The overall parity indicator on output line 23 is sent to a parity evaluate circuit 27 which sends a true signal to a decoding table circuit 29 and a correction circuit 31 if the overall parity is bad and which sends a true signal to a checking number compare circuit 33 if the overall parity indicator on output line 23 indicates good parity.

The checking number compare circuit 33 is realized in the preferred embodiment by a simple digital compare circuit and functions to compare the nine-bit checking number on output bus 25 to zero. If the nine-bit checking number is equal to zero, a zero error indicator 35 is activated to generate a bit, flag, or other indication to initiate action deemed appropriate. If the nine-bit checking number is not equal to zero, a detected even error indicator 37 is activated to generate a bit, flag, or other indication to initiate action deemed appropriate (retry, print-out, shut-down, etc.).

If output on line 23 indicates bad parity, the parity evaluate circuit 27 activates the decoding table 29. The function of the decoding table 29 is shown in FIG. 4 and can be seen to be that basically of a ROM addressed by the nine-bit checking number bus 25 and ouputting to a seven-bit checking number bus 25 and outputting to a seven-bit correctable valid address bus 39. Beyond the basic ROM-type address conversion function, the decoding table circuit 29 generates a single control bit for a detected odd error indicator circuit 41 when the address conversion yields an invalid address, as shown in FIG. 3. The detected odd error indicator circuit generates a bit, flag, or other indication to initiate action deemed appropriate.

The correction circuit 31 is activated by the parity evaluate circuit 27 when bad parity is indicated on the overall parity line 23. The correction circuit receives the address (or bit location) of a bit to be corrected (i.e., complemented) from the decoding table circuit 29. The correction circuit 31 operates in conjunction with a 64-bit register 43 which stores the check bits and data word to be corrected. The correction circuit 31 merely complements the bit location indicated on the correctable valid address bus 39 and the correction is completed with the correct check bits and data word residing in the 64-bit register 43.

It will be appreciated that while only a specific embodiment of the present invention and method of practicing the same has been described and illustrated, changes and modifications therein will be apparent to one skilled in the art. The above description of the illustrated embodiments of the invention has been by way of example only and should not be taken as a limitation of the scope of the invention.

What is claimed is:

1. A method of detecting and correcting errors in a binary named-data code word comprising a data word field, a data name field and a field of check bits covering both the data word and the data name field, said method comprising the steps of:
    performing a parity check on said binary named-data code word to generate an overall parity indicator and a checking number;
    generating an even error indicator if said overall parity indicator indicates good parity and said checking number equals any number other than zero;
    generating a zero error indicator if said overall parity indicator indicates good parity and said checking number equals zero;
    decoding said checking number if said overall parity indicator indicates bad parity to generate from said checking number an error bit address;
    generating an odd error indicator if said error bit address lies outside the fields of said data word and said check bits; and
    complementing the bit in said binary named-data word at said error bit address if said error bit address lies within either said data word field or said field of check bits.

2. The method of claim 1 wherein said step of performing a parity check generates a single-bit overall parity indicator and a nine-bit checking number.

3. The method of claim 1 wherein said step of performing a parity check generates said overall parity indicator and said checking number by the step of multiplying said binary named-data code word times a two-dimensional parity check matrix.

4. The method of claim 3 wherein said two-dimensional parity check matrix includes a data word segment for error checking of said data word field in said binary named-data code word and a data name segment for error checking of said data name field in said binary named-data code word.

5. The method of claim 4 wherein said data word segment includes a plurality of eight-column groups, each column therein including a plurality of column bits to differentiate one eight-column group from another within said plurality thereof, a plurality of column bits to differentiate one column from another within the same eight-column group in said plurality thereof, and a plurality of column bits to map multi-bit odd errors occuring in said data word field of said binary named-data code word into addresses lying outside said fields of said data word and said check bits.

6. The method of claim 4 wherein said data name segment includes a plurality of eight-column groups, each column therein including a plurality of column bits to map most multi-bit odd errors occurring in said data name field of said binary named-data code word into addresses lying outside said fields of said data word and said check bits.

7. An apparatus for detecting and correcting errors in a binary named-data code word comprising a data word field, a data name field and a field of check bits covering both the data word and the data name field, said apparatus comprising:
    means for performing a parity check on said binary named-data code word to generate an overall parity indicator and a checking number;
    means connected to said parity check performing means for generating an even error indicator if said overall parity indicator indicates good parity and said checking number equals any number other than zero and also for generating a zero error indicator if said overall parity indicator indicates good parity and said checking number equals zero;
    means connected to said parity check performing means for decoding said checking number if said overall parity indicator indicates bad parity to generate from said checking number an error bit address;
    means connected to said decoding means for generating a detected odd error indication if said error bit address lies outside the fields of said data word and said check bits; and
    means for complementing the bit in said binary named-data word at said error bit address if said error bit address lies within either said data word field or said field of check bits.

8. The apparatus according to claim 7 wherein said means for decoding includes a memory addressable by said checking number for outputting said error bit address.

9. The apparatus according to claim 8 wherein said memory is a read-only memory.

10. The apparatus according to claim 7 wherein said overall parity indicator is a single-bit overall parity indicator and said checking number is a nine-bit checking number.

11. The apparatus according to claim 7 wherein said means for performing a parity check includes means for multiplying said binary named-data code word times a two-dimensional parity check matrix to generate said overall parity indicator and said checking number.

12. The apparatus of claim 11 wherein said two-dimensional parity check matrix in said step of performing includes a data word segment for error checking of said data word field in said binary named-data code word and a data name segment for error checking of said data name field in said binary named-data code word.

13. The apparatus of claim 12 wherein said data word segment includes a plurality of eight-column groups, each column therein including a plurality of column bits to differentiate one eight-column group from another within said plurality thereof, a plurality of column bits to differentiate one column from another within the same eight-column group in said plurality thereof, and a plurality of column bits to map multi-bit odd errors occuring in said data word field of said binary named-data code word into addresses lying outside said fields of said data word and said check bits.

14. The method of claim 13 wherein said data name segment includes a plurality of eight-column groups, each column therein including a plurality of column bits to map most multi-bit odd errors occurring in said data name field of said binary named-data code word into addresses lying outside said fields of said data word and said check bits.

* * * * *